United States Patent
Kokkinakis et al.

(10) Patent No.: US 11,322,168 B2
(45) Date of Patent: May 3, 2022

(54) DUAL-MICROPHONE METHODS FOR REVERBERATION MITIGATION

(71) Applicant: MED-EL Elektromedizinische Geraete GmbH, Innsbruck (AT)

(72) Inventors: Kostas Kokkinakis, Durham, NC (US); Joshua Stohl, Durham, NC (US)

(73) Assignee: MED-EL Elektromedizinische Geraete GmbH, Innsbruck (AT)

(*) Notice: Subject to any disclaimer, the term of this patent is extended or adjusted under 35 U.S.C. 154(b) by 0 days.

(21) Appl. No.: 17/267,758

(22) PCT Filed: Aug. 9, 2019

(86) PCT No.: PCT/US2019/045831
§ 371 (c)(1),
(2) Date: Feb. 10, 2021

(87) PCT Pub. No.: WO2020/036813
PCT Pub. Date: Feb. 20, 2020

(65) Prior Publication Data
US 2021/0166713 A1    Jun. 3, 2021

Related U.S. Application Data

(60) Provisional application No. 62/717,945, filed on Aug. 13, 2018.

(51) Int. Cl.
*G10L 21/0224* (2013.01)
*G10L 21/0316* (2013.01)
(Continued)

(52) U.S. Cl.
CPC ...... *G10L 21/0224* (2013.01); *G10L 21/0316* (2013.01); *G10L 25/21* (2013.01);
(Continued)

(58) Field of Classification Search
None
See application file for complete search history.

(56) References Cited

U.S. PATENT DOCUMENTS 8,751,029 B2   6/2014 Soulodre
8,842,861 B2   9/2014 Westermann et al.
(Continued)

OTHER PUBLICATIONS

International Searching Authority, U.S., International Search Report and the Written Opinion of the International Searching Authority, PCT/US2019/045831, dated Nov. 20, 2019, 14 pages.
(Continued)

*Primary Examiner* — Paul W Huber
(74) *Attorney, Agent, or Firm* — Sunstein LLP (57) ABSTRACT

A dual microphone signal processing arrangement for reducing reverberation is described. Time domain microphone signals are developed from a pair of sensing microphones. These are converted to the time-frequency domain to produce complex value spectra signals. A binary gain function applies frequency-specific energy ratios between the spectra signals to produce transformed spectra signals. A sigmoid gain function based on an inter-microphone coherence value between the transformed spectra signals is applied to the transformed spectra signals to produce coherence adapted spectra signals. And an inverse time-frequency transformation is applied to the coherence adjusted spectra signals to produce time-domain reverberation-compensated microphone signals with reduced reverberation components.

14 Claims, 10 Drawing Sheets

(51) Int. Cl.
*G10L 25/21* (2013.01)
*H04R 1/40* (2006.01)
*H04R 3/00* (2006.01)
*G10L 21/0208* (2013.01)
*G10L 21/0216* (2013.01)

(52) U.S. Cl.
CPC ............ *H04R 1/406* (2013.01); *H04R 3/005* (2013.01); *G10L 2021/02082* (2013.01); *G10L 2021/02165* (2013.01)

(56) References Cited

U.S. PATENT DOCUMENTS

| | | | |
|---|---|---|---|
| 9,538,297 | B2 | 1/2017 | Hazrati et al. |
| 10,115,411 | B1* | 10/2018 | Chu .................... G10L 21/0232 |
| 2008/0004873 | A1 | 1/2008 | Liu et al. |
| 2015/0256956 | A1 | 9/2015 | Jensen et al. |
| 2016/0275966 | A1 | 9/2016 | Jazi et al. |
| 2017/0236528 | A1* | 8/2017 | Lepauloux .......... G10L 21/0232 704/233 |

OTHER PUBLICATIONS

Kostas Kokkinakis et al., A channel-selection criterion for suppressing reverberation in cochlear implants, J. Acoust. Soc. Am., vol. 129, No. 5, May 2011, pp. 3221-3232.

Jill M. Desmond, Using Channel-Specific Models to Detect and Mitigate Reverberation in Cochlear Implants, Ph.D. Dissertation, Duke University, 2014, 126 pages.

Michelle Mason et al., Perception of Consonants in Reverberation and Noise by Adults Fitted with Bimodal Devices, J. Speech Lang Hear Res., vol. 57, No. 4, Aug. 1, 2014, pp. 1512-1520.

Oldooz Hazrati et al., Reverberation suppression in cochlear implants using a blind channel-selection strategy, J. Acoust. Soc. Am., vol. 133, No. 6, Jun. 2013, pp. 4188-4196.

* cited by examiner

DUAL-MICROPHONE METHODS FOR REVERBERATION MITIGATION

This application is a 371 national phase entry of Patent Cooperation Treaty Application PCT/US2019/045831, filed Aug. 9, 2019, which in turn claims priority from U.S. Provisional Patent Application 62/717,945, filed Aug. 13, 2018. Each of the above-described applications is incorporated herein by reference in its entirety.

TECHNICAL FIELD

The present invention relates to a front-end signal processing algorithm that suppresses reverberant components of an audio signal recorded through the microphones of an external audio processor that may be part of a mobile phone, portable recording system, hearing aid device, or a cochlear implant system.

BACKGROUND ART

Acoustic reverberation is a common phenomenon observed in almost all enclosed spaces. It is defined as the sum total of all sound reflections arriving at a certain point inside an acoustical enclosure after the enclosure has been excited by an impulsive sound signal. External microphones which provide an audio signal input to an audio processor (e.g., hearing aid, cochlear implant processor, mobile phone) are at some distance from the sound sources. Therefore, these external microphones not only detect audio signals generated by the audio sources of interest directly, but also detect attenuated or dampened reflections of the audio signals with some time delay due to the acoustics of the enclosed space.

The acoustic spectrum detected by the external sensing microphone, and therefore the corresponding microphone signal outputs, are smeared over time. In general, the number of reflections increase when audio or speech signals are communicated inside medium-to-large rooms built with reflective surfaces (e.g., classrooms). In such reverberant enclosures, speech intelligibility is hindered even when there is no background noise. This statement applies to automatic speech recognition systems and also to individuals relying on amplification or a cochlear implant audio processor to perceive acoustic signals. On average, basic psychoacoustic experiments have shown that signal components corrupted by additive reverberant energy disrupt speech understanding, and more specifically, intelligibility of reverberant speech declines exponentially with a linear increase in reverberation time (e.g., see Kokkinakis et al., "A channel-selection criterion for suppressing reverberation in cochlear implants", Journal of the Acoustical Society America, vol. 129, no. 5, pp. 3221-3232, May 2011; Desmond, Jill Marie. "Using Channel-Specific Models to Detect and Mitigate Reverberation in Cochlear Implants." PhD diss., 2014; Mason, Michelle, and Kostas Kokkinakis. "Perception of consonants in reverberation and noise by adults fitted with bimodal devices." *Journal of Speech, Language, and Hearing Research* 57, no. 4 (2014): 1512-1520; all of which are incorporated herein by reference in their entireties), even in quiet listening settings.

In the article by Kokkinakis et al., a method for calculating a reverberant binary mask is disclosed. To generate the binary mask, the reverberant signal, such as the output of a corresponding microphone signal, is first transformed into the time-frequency (T-F) domain. In addition, the 'clean signal', used to describe a (clean) target acoustic signal (e.g. speech), which has not yet been corrupted by room acoustics, is also transformed into the time-frequency domain. In the next stage, a comparison is carried out between the energy of the clean (or uncorrupted) signal and that of the reverberant (or corrupted) signal. This comparison is carried out separately for each unit in the time-frequency representation. If the energy of the clean sound exceeds that of the reverberant sound (clean signal is dominant), the particular T-F unit is marked with a one in the binary mask. Time-frequency bins containing regions where the energy of the reverberant signal is dominant are marked with zero. Ones in the binary mask represent regions in time and frequency that are retained and zeros represent regions that need to be discarded. Despite the superior performance observed with this technique, practical implementation in a hearing assistive or other device is not feasible given that the algorithm requires prior knowledge of the clean signal, which in realistic scenarios cannot be guaranteed.

U.S. Pat. No. 9,538,297 and Hazrati and Loizou, "Reverberation suppression in cochlear implants using a blind channel-selection strategy", Journal of the Acoustical Society America, vol. 133, no. 6, pp. 4188-4196, June 2013 (incorporated herein by reference in its entirety) both describe another method for enhancing reverberant speech recognition performance for cochlear implant users that operates by using only information that can be captured from a single microphone and thus requires no a priori knowledge of the clean signal. This is directed to a single channel mask estimation whereby the binary mask in the time-frequency domain is estimated by comparing the energy ratio of the reverberant signal with the energy ratio of another 'residual signal' computed directly from the reverberant signal using linear prediction analysis. Several problems associated with this method exist in that: (1) overall speech quality may be degraded, (2) large amounts of reverberant energy may not be entirely suppressed, and (3) the linear prediction analysis stage will not be reliable when background noise is present in addition to reverberation.

SUMMARY

Embodiments of the present invention are directed to a system and method of dual microphone signal processing to reduce reverberation. A pair of sensing microphones develop time domain microphone signals having sound source components and reverberation components. A spectral converter converts the microphone signals to time-frequency domain to produce complex value spectra signals. A binary masking module determines frequency-specific energy ratios between the spectra signals and applies a binary gain function to the spectra signals based on the energy ratios to produce transformed spectra signals. A soft masking module determines an inter-microphone coherence value between the transformed spectra signals and applies a sigmoid gain function to the transformed spectra signals based on the inter-microphone coherence value to produce coherence adapted spectra signals. And a time domain transform module applies an inverse time-frequency transformation to the coherence adjusted spectra signals to produce time-domain reverberation-compensated microphone signals with reduced reverberation components.

In further specific embodiments, the soft masking module uses a two-dimensional enhancement image filter to produce an edge image enhanced sigmoid gain function that is applied to the transformed spectra signals. The soft masking module may determine the inter-microphone coherence value as a function of power spectral densities of the transformed spectra signals and/or may adaptively determine the sigmoid gain function for specific frequencies in the transformed spectra signals.

The binary masking module may compare individual frequency-specific energy ratios to a selected threshold value to reduce the reverberation components and/or may determine the sigmoid gain function as a tunable two-parameter logistic sigmoid function. And there may be an audio output module that generates an audio output signal from the reverberation-compensated microphone signals.

DETAILED DESCRIPTION

Figure 1:
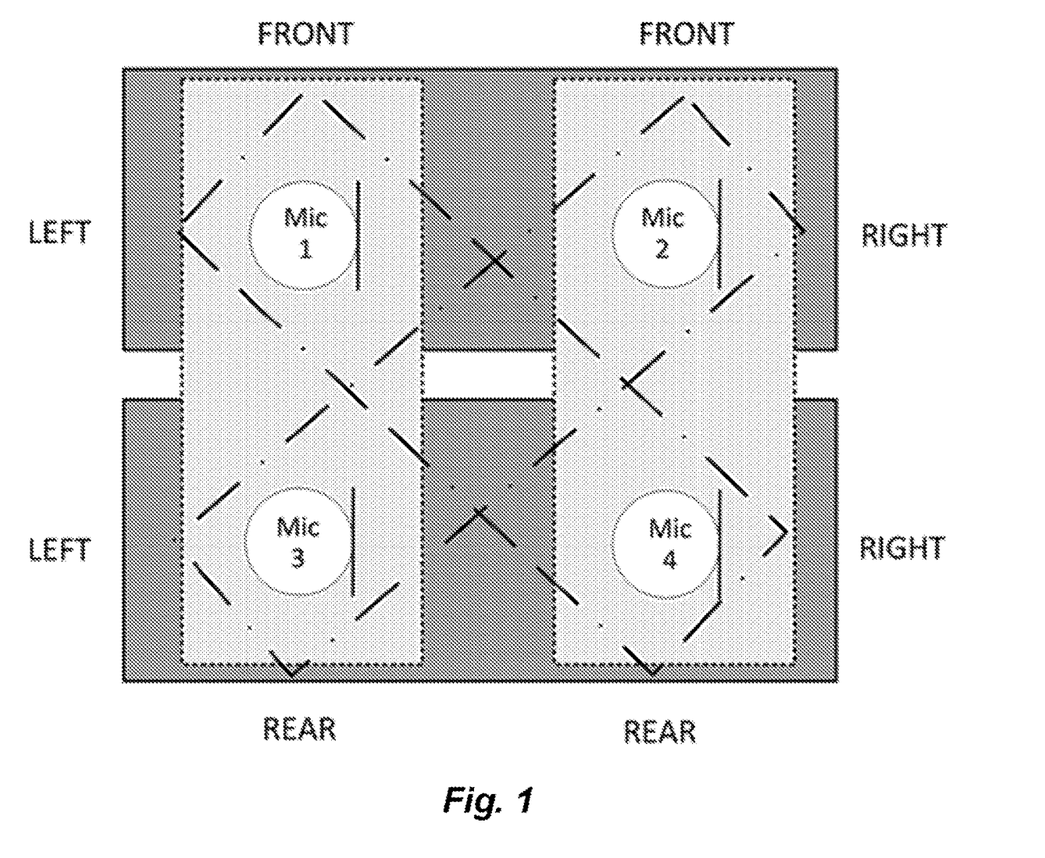
FIG. 1 shows a schematic illustration of an embodiment of the present invention based on dual microphone arrangements.

Various embodiments of the present invention are directed to techniques for dual microphone signal processing to reduce reverberation. Although the following is described in the specific context of two microphone signals, it will be understood that the invention is not limited in that regard, and may equally be applied to contexts with more than two microphones. For example, as shown in FIG. 1:

Mic A=Mic 1 and Mic B=Mic 3, referred to as a front-left and rear-left configuration Mic A=Mic 2 and Mic B=Mic 4, referred to as the front-right and rear-right configuration Mic A=Mic 1 and Mic B=Mic 2, referred to as the front-left and front-right configuration Mic A=Mic 3 and Mic B=Mic 4, referred to as the rear-left and rear-right configuration Mic A=Mic 1 and Mic B=Mic 4, referred to as the front-left and rear-right configuration Mic A=Mic 2 and Mic B=Mic 3, referred to as the front-right and rear-left configuration.

Two time domain microphone signals $x_A(n)$ and $x_B(n)$ from first and the second sensing microphones are transformed to the time-frequency (T-F) domain by using short-time Fourier transform (STFT) to produce complex valued spectra $X_A(\omega,k)$ and $X_B(\omega,k)$, where ω represents the frequency band and k denotes the time frame. The concept of time-frequency analysis is well-known within the art.

A selection criterion can be based on frequency-specific energy ratios (ER) between the two sensing microphones (which may be, for example, placed on each side of the head in the case of hearing devices) and can be defined by utilizing the time-frequency transformations of the inputs to the first and second microphone signals. This criterion can be computed separately for each specific frequency bin as follows:

$$ER(\omega, k) = 10\log_{10}\frac{|X_A(\omega, k)|^2}{|X_B(\omega, k)|^2} \quad (1)$$

In the specific case of two sensing microphones placed on opposite sides of the head, the ER criterion exploits the energy difference between the two sides arising due to the acoustic shadow of the head. In the case of the two sensor elements being placed in the same audio processor (e.g., end-fire array), the ER criterion relies on the energy difference due to sound propagation, meaning that the signal from the rear microphone needs to be appropriately delayed by the time that it takes the sound to travel between the two microphone elements. In both cases, by utilizing the ER metric described in Eq. (1), only T-F regions corresponding to signals originating from the front of the listener are retained. In consequence, this produces T-F units with a higher overall SNR.

Figure 2:
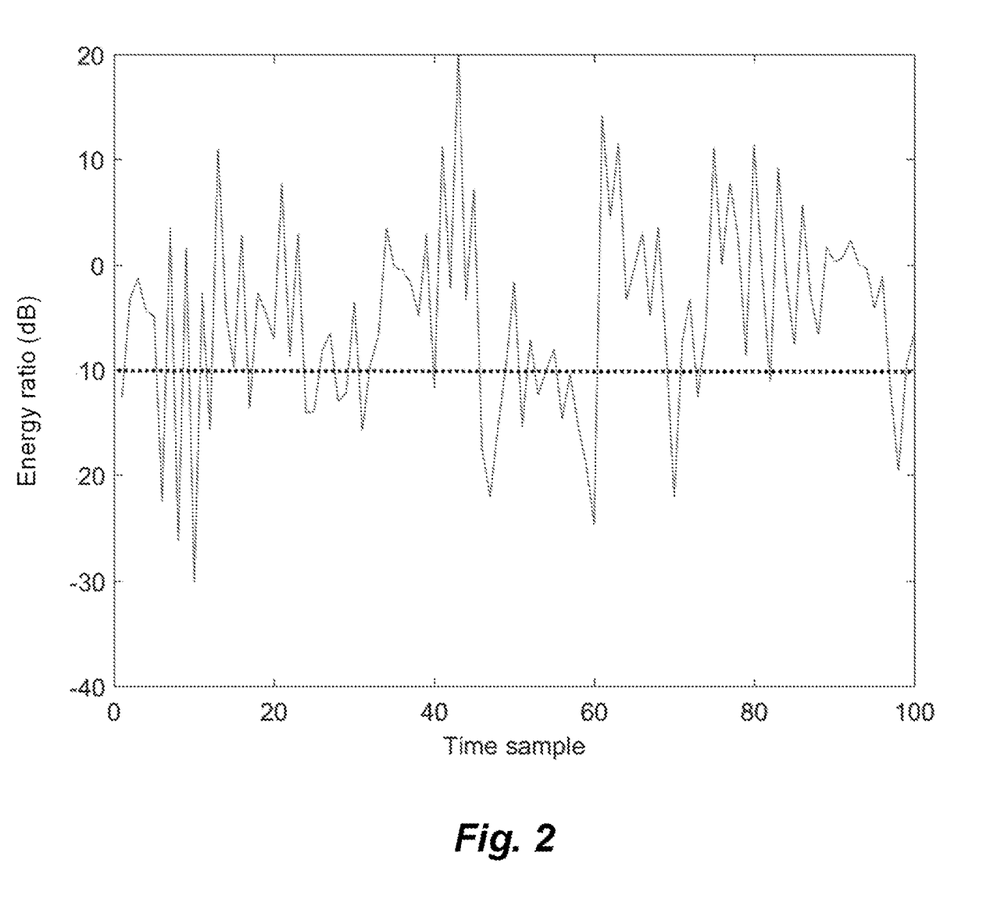
FIG. 2 shows instantaneous ER values (dB) calculated between the two microphones along with the preset threshold value fixed at −10 dB (dashed line) for the frequency bin centered at 1,500 Hz.

To remove the additive reverberation components present in the microphone signal recorded from the two sensing microphones, a comparison of the individual frequency-specific ER values against an empirically determined threshold value, T, can be carried out. FIG. 2 shows a specific example of the instantaneous ER values (dB) calculated between the two microphones along with the preset threshold value fixed at −10 dB (dashed line) for the frequency bin centered at 1500 Hz.

Figure 3:
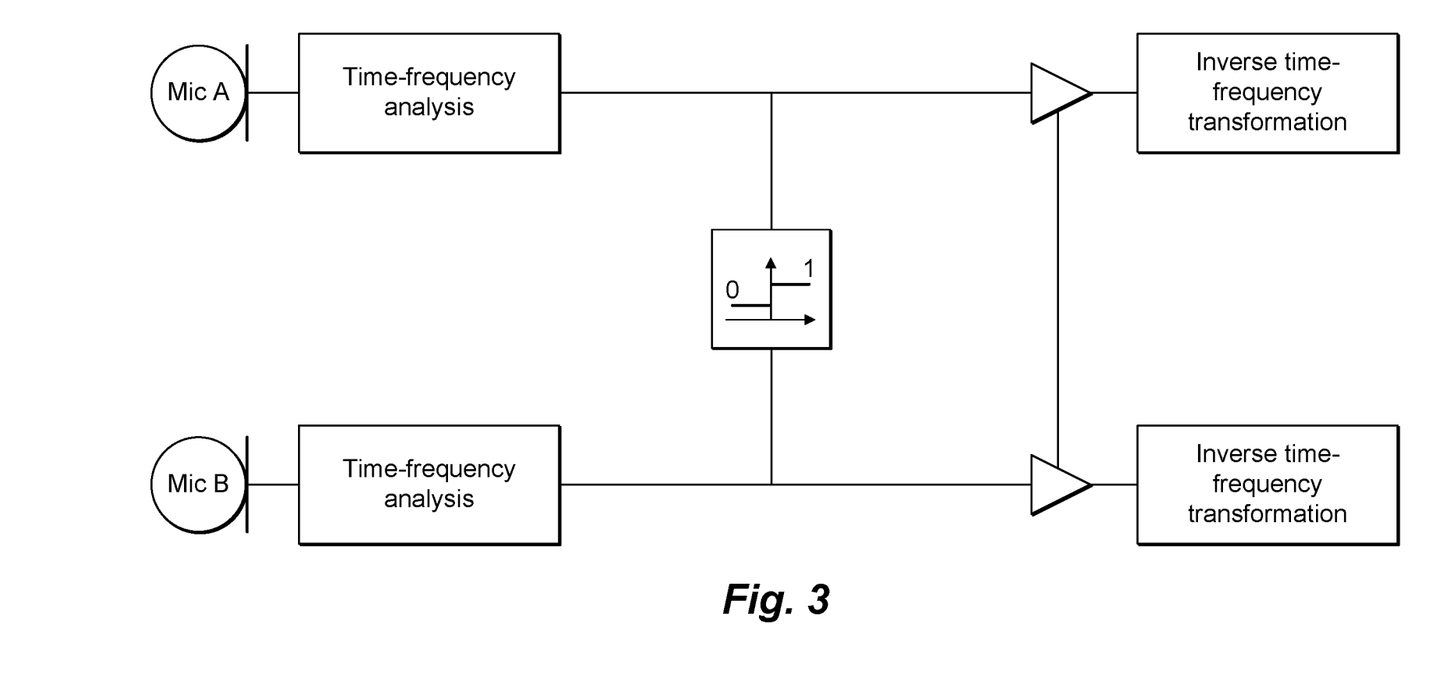
FIG. 3 shows a functional block diagram of the signal processing arrangement according to an embodiment of the present invention.

According to an embodiment as shown in FIG. 3, the two complex-value spectra signals from the two sensing microphones (microphone A and B) are processed by a binary time-frequency mask or equivalently a binary gain function denoted by $G_1(\omega,k)$. This mask (or gain) takes the value of one when ER(ω,k)>T, and is zero otherwise and is equal to:

$$G_1(\omega, k) = \begin{cases} 1, & ER(\omega, k) > T \\ 0, & \text{otherwise} \end{cases} \quad (2)$$

where T represents the threshold value, expressed in dB. The threshold parameter T may be a scalar or a vector containing frequency-specific thresholds. In the one specific embodiment shown in FIG. 3, the calculated gain $G_1(\omega,k)$ is applied to the time-frequency distribution of the first microphone spectra signal $X_A(\omega,k)$ and the time-frequency distribution of the second microphone spectra signal $X_B(\omega,k)$. This produces a new set of transformed spectra signals that can subsequently be transformed back to the time-domain using an inverse time-frequency transformation.

Figure 4:
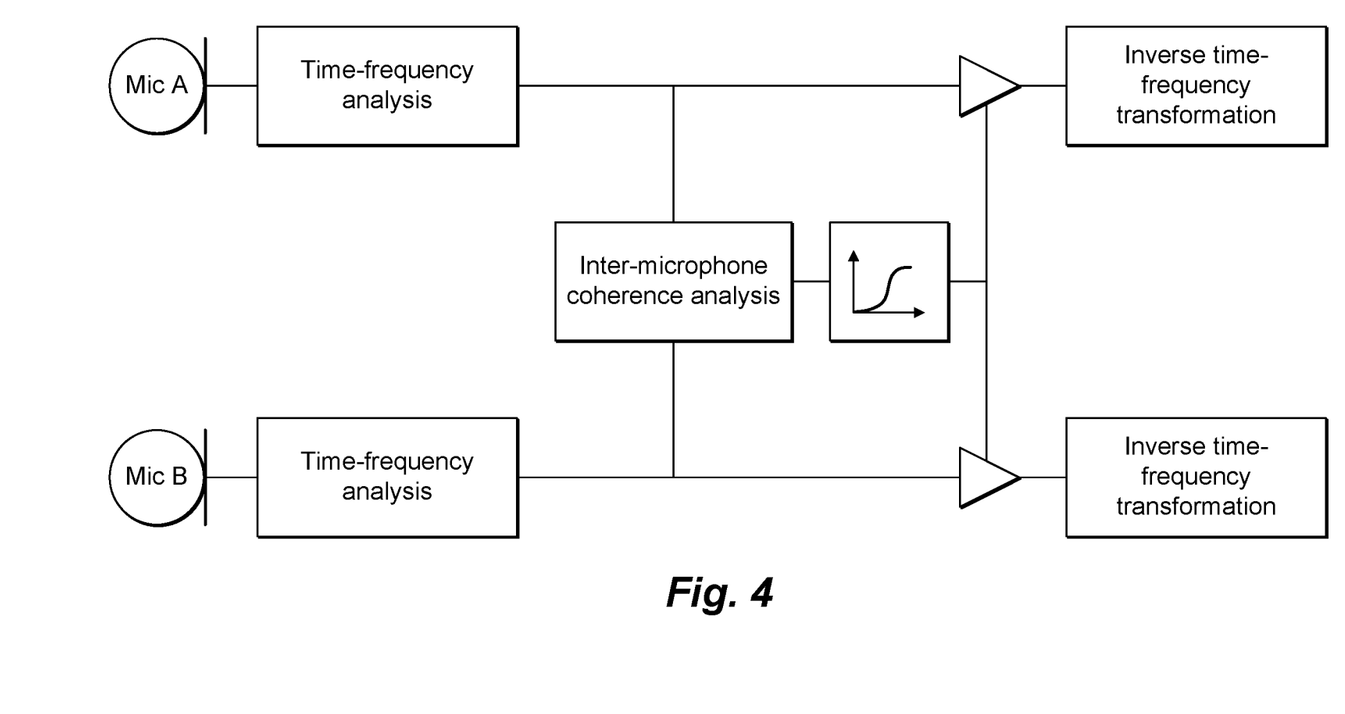
FIG. 4 shows a functional block diagram of the signal processing arrangement according to another embodiment of the present invention.

In another embodiment of the present invention illustrated in FIG. 4, the inter-microphone coherence can be obtained from the first microphone signal and the second microphone signal. From the time-frequency complex valued spectra $X_A(\omega,k)$ and $X_B(\omega,k)$ of the first and second sensing microphones (microphones A and B), the inter-microphone coherence function can be written as a function of the power spectral densities:

$$\Gamma_{AB}(\omega, k) = \frac{|\Phi_{AB}(\omega, k)|}{\sqrt{\Phi_{AA}(\omega, k)\Phi_{BB}(\omega, k)}} \qquad (3)$$

where $\Phi_{AA}(\omega,k)$, $\Phi_{BB}(\omega,k)$ and $\Phi_{AB}(\omega,k)$ are the exponentially weighted short-term auto-power and cross-power spectral density functions defined as:

$$\Phi_{AA}(\omega,k)=\alpha\Phi_{AA}(\tau-1,\omega)+(1-\alpha)|X_A(\omega,k)|^2 \qquad (4)$$

$$\Phi_{BB}(\omega,k)=\alpha\Phi_{BB}(\tau-1,\omega)+(1-\alpha)|X_B(\omega,k)|^2 \qquad (5)$$

$$\Phi_{AB}(\omega,k)=\alpha\Phi_{AB}(\omega,k)+(1-\alpha)X_B(\omega,k)X^*_A(\omega,k) \qquad (6)$$

and where $0 \leq \alpha \leq 1$ is the smoothing parameter and * denotes the complex conjugate.

Figure 5A:
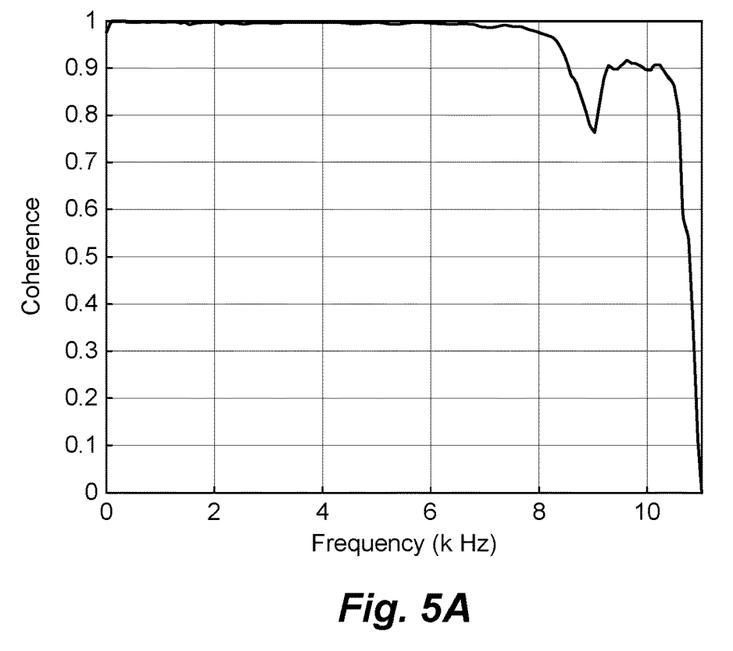
FIG. 5A shows magnitude of coherence values obtained inside an anechoic environment.
Figure 5B:
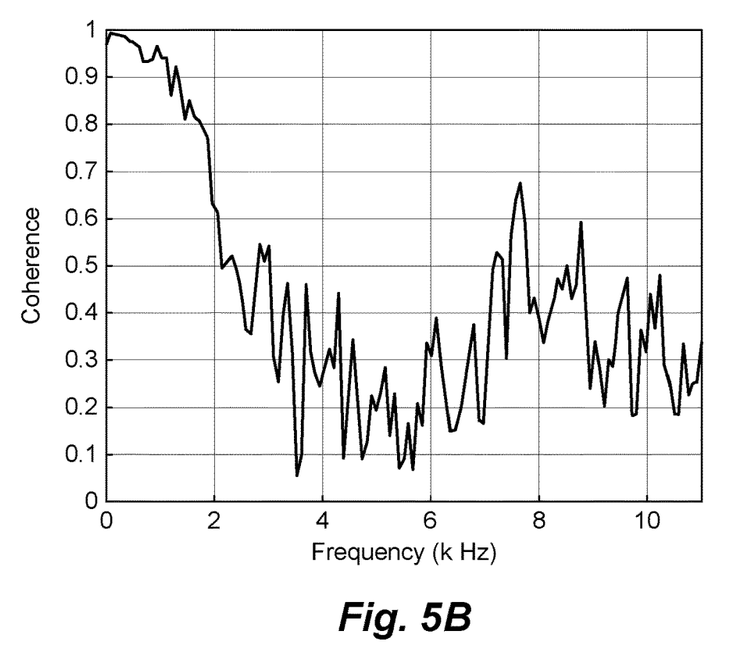
FIG. 5B shows magnitude of coherence values obtained inside a reverberant environment.

These coherence values yield values between 0 (for fully incoherent signals) and 1 (for fully coherent signals). The coherence value is a function of frequency with values between 0 and 1 that indicates how well the signal recorded at microphone A corresponds to the signal recorded at microphone B in each separate frequency bin. An example of the magnitude of coherence values between the first and second microphone signals recorded inside an anechoic environment is provided in FIG. 5A. An example of the magnitude of coherence values between the first and second microphone signals recorded inside a reverberant environment with reverberation time equal to 0.6 seconds is provided in FIG. 5B.

Figure 6:
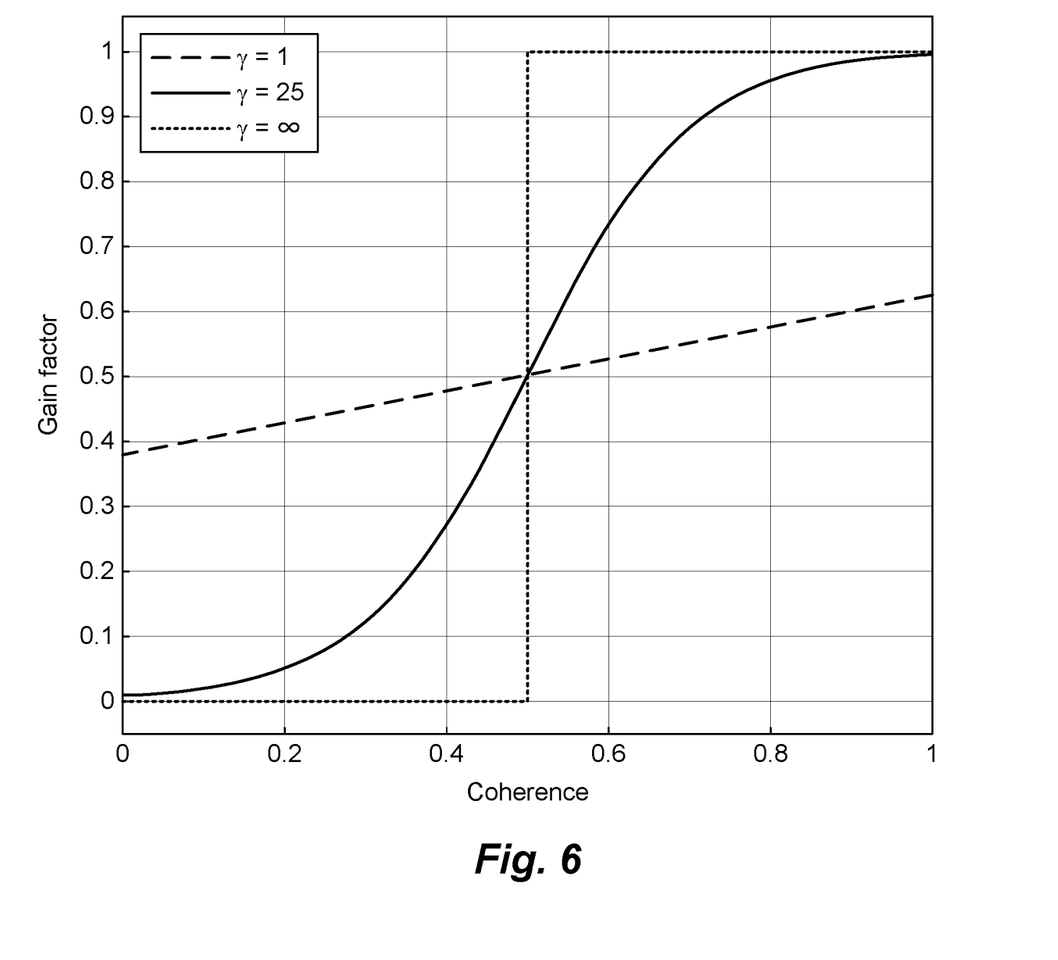
FIG. 6 is a plot of the gain curve representing a typical sigmoidal function defined for different values of parameter γ which controls the sigmoidal slope.

After the coherence values have been obtained, a sigmoidal mapping stage is subsequently applied to the coherence values to construct a coherence-to-gain mapping through the use of a tunable two-parameter logistic sigmoid gain function denoted by $G_2(\omega,k)$ which is equal to:

$$G_2(\omega, k) = \frac{1}{1 + \exp[-\gamma(\omega)(\Gamma_{AB}(\omega, k) - \beta(\omega))]} \qquad (7)$$

where parameter $\gamma$ controls the sigmoidal slope and parameter $\beta$ denotes the offset along the horizontal axis. A steep sigmoidal function characterized by a large value of $\gamma$ will suppress samples with low coherence by applying a low gain factor and retain samples with high coherence values. A less aggressive mapping function defined by a relatively small value, for example $\gamma=1$, will apply a more linear mapping and attenuate samples with low coherence values relative to the attenuation applied to samples with high coherence values. FIG. 6 plots the gain curve representing different versions of the sigmoid function described in Eq. (7) defined for different values of parameter $\gamma$. Note that in this example parameter $\beta$ that represents the inflection point of the sigmoid is kept constant at 0.5.

Both parameters $\gamma$ and $\beta$ may be determined adaptively for each frequency band $\omega$. First, to adaptively determine the optimal values for $\gamma$ and $\beta$ in Eq. (7), the upper 3rd quartile inter-microphone coherence values are calculated for each frequency band, such as:

$$\hat{\Gamma}_{AB}(\omega) = Q_3[\Gamma_{AB}(\omega,k)] \qquad (8)$$

Figure 7:
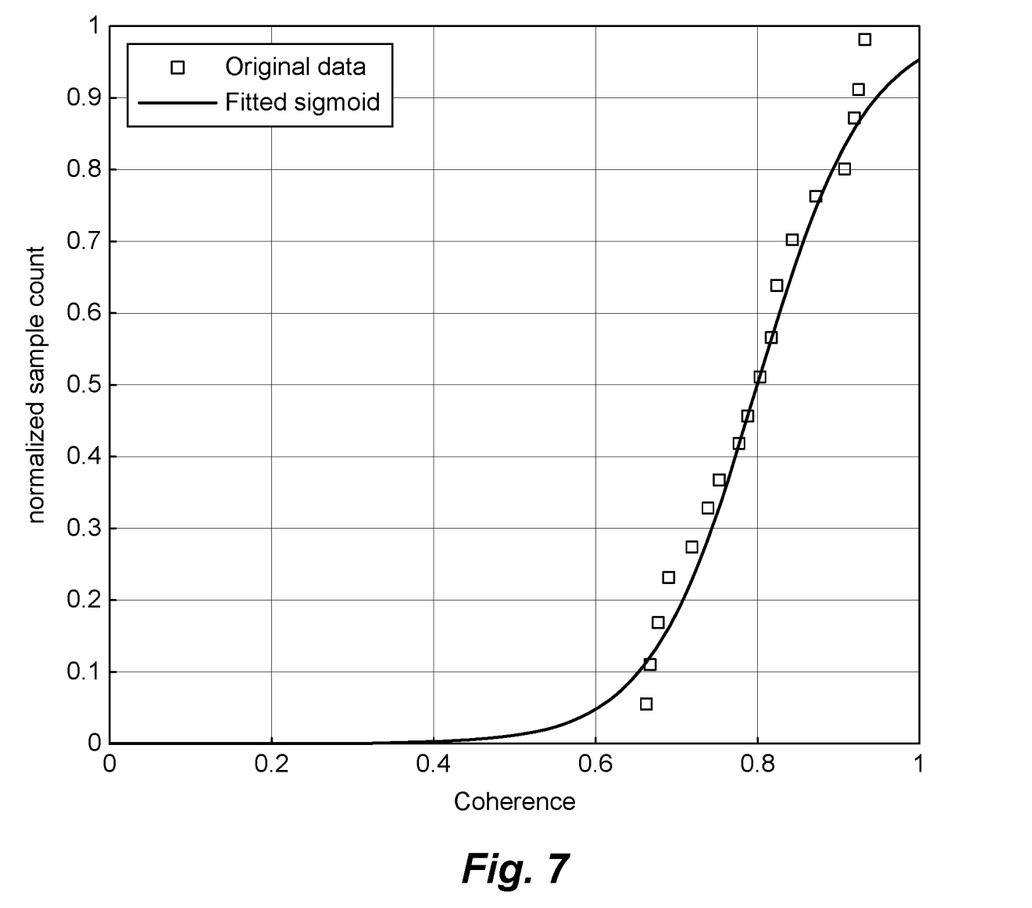
FIG. 7 is an illustration of the fit of the sigmoid function to the cumulative density function calculated from the coherence values between the two microphone sensors.

Next, nonlinear least squares regression is used to fit the shape of a Gaussian cumulative distribution function to the upper 3rd quartile ($Q_3$) of the inter-microphone coherence. FIG. 7 illustrates the fit of the sigmoid function to the density function calculated from the inter-microphone coherence values.

In the specific embodiment illustrated in FIG. 4, the calculated gain $G_2(\omega,k)$ is applied to the time-frequency distribution of the first microphone spectra signal $X_A(\omega,k)$ and the time-frequency distribution of the second microphone spectra signal $X_B(\omega,k)$. This produces a new set of transformed spectra signals that are subsequently transformed back to the time-domain using an inverse time-frequency transformation.

Figure 8:
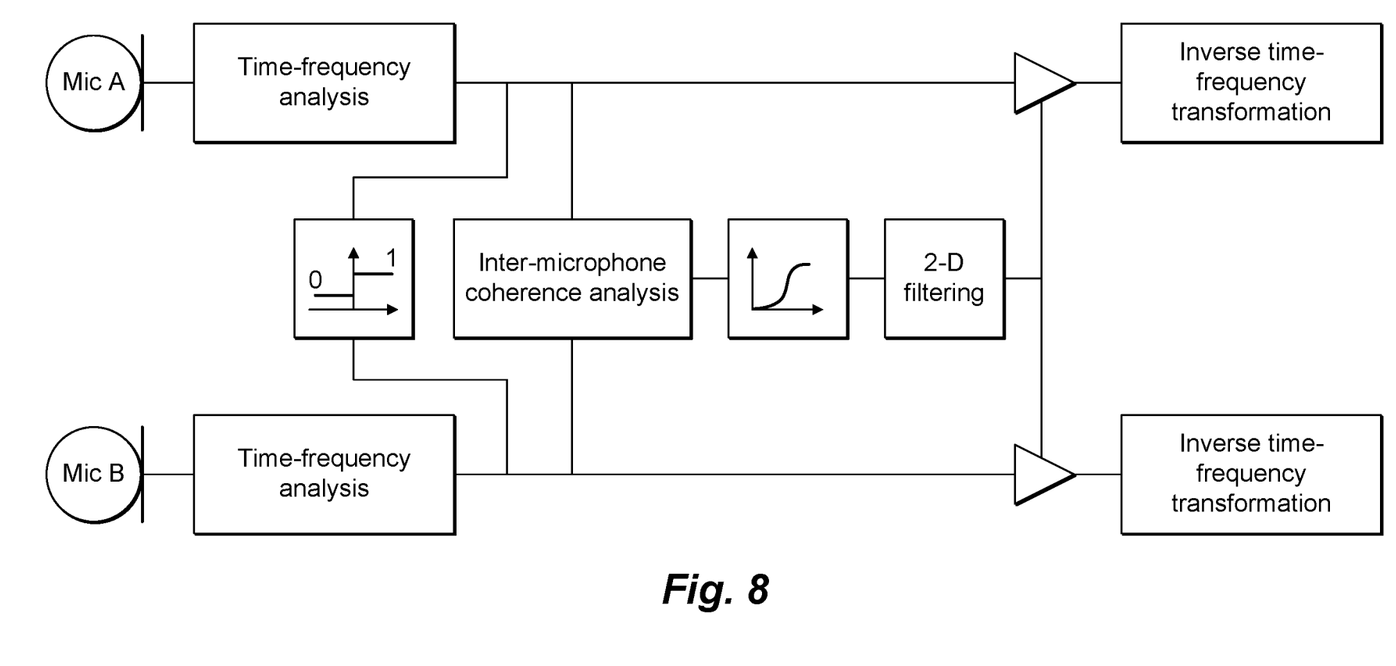
FIG. 8 shows a functional block diagram of the signal processing arrangement according to another embodiment of the present invention.
Figure 9:
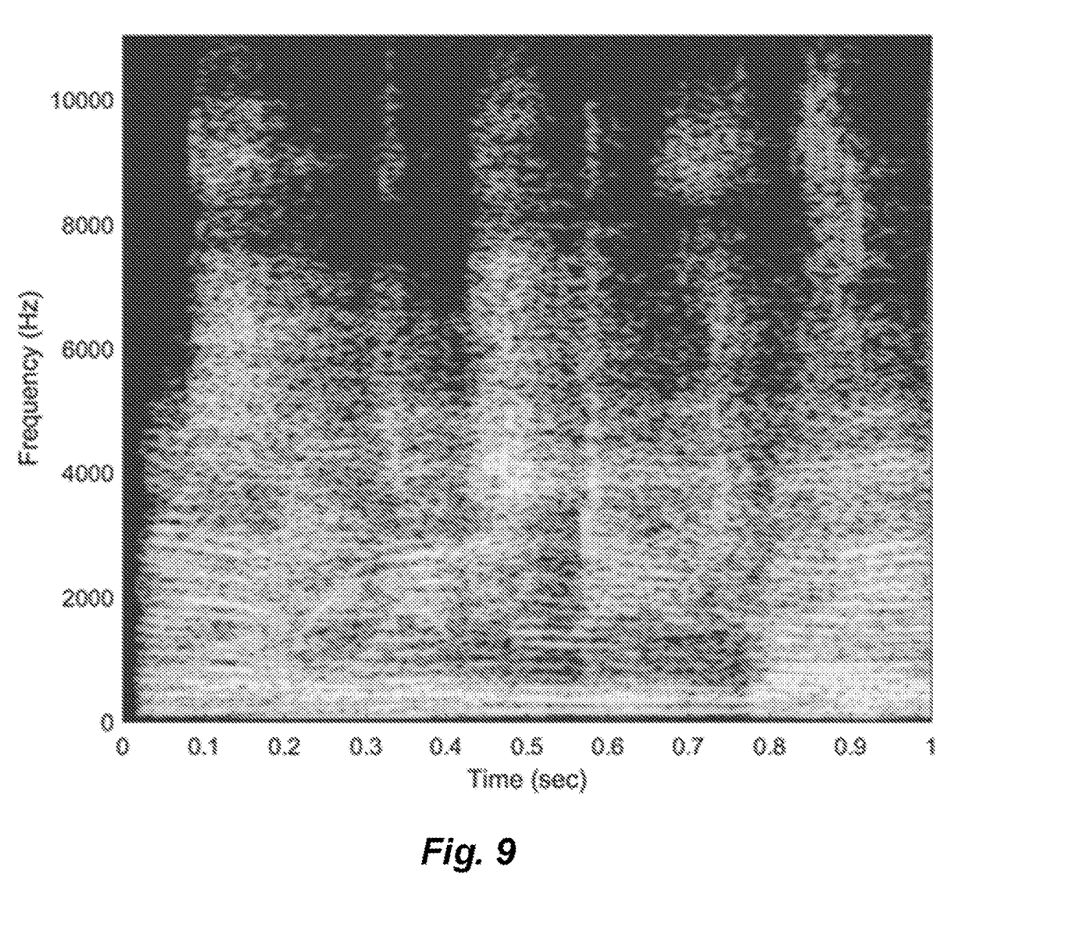
FIG. 9 is a spectrogram of a 1.0 second phrase recorded inside an acoustical enclosure with reverberation time equal to 0.6 seconds.

FIG. 8 shows a functional block diagram of the signal processing arrangement according to another embodiment of the present invention. A pair of sensing microphones develop time domain microphone signals $x_A(n)$ and $x_B(n)$ having sound source components and reverberation components. A spectral converter converts the microphone signals to time-frequency domain to produce complex value spectra signals $X_A(\omega,k)$ and $X_B(\omega,k)$, where $\omega$ represents the frequency band and k denotes the time frame. A binary masking module determines frequency-specific energy ratios ER between the spectra signals and applies a binary gain function gain $G_1(\omega,k)$ (as described in Eq. (2)) to the microphone spectra signals based on the energy ratios to produce transformed spectra signals. That is, the binary gain function gain $G_1(\omega,k)$ is applied the T-F distribution of the first microphone spectra signal $X_A(\omega,k)$ and the T-F distribution of the second microphone spectra signal $X_B(\omega,k)$. This will provide a new set of transformed spectra signals that are subsequently referred to as $Y_A(\omega,k)$ and $Y_B(\omega,k)$ whose spectrogram is depicted in FIG. 9.

A soft masking module then determines an inter-microphone coherence value of the transformed spectra signals $Y_A(\omega,k)$ and $Y_B(\omega,k)$ (as described in Eqs. (3)-(6) and above) and for each separate T-F unit applies a sigmoid gain function $G_2(\omega,k)$ (as described in Eqs. (7)-(8) and above) to the transformed spectra signals $Y_A(\omega,k)$ and $Y_B(\omega,k)$ based on the inter-microphone coherence value to produce coherence adapted spectra signals. The soft decision mask denoted by $G_2(\omega,k)$ may further be post-processed via a 2-D enhancement image filter derived from a basic image processing technique called "spatial sharpening" or unsharp masking. Unsharp masking produces an edge image $E(\omega,k)$ from the input image $G_2(\omega,k)$ via the transformation:

$$E(\omega,k)=G_2(\omega,k)-G_{smooth}(\omega,k) \qquad (9)$$

where $G_{smooth}(\omega,k)$ is a smoothed version of the original image $G_2(\omega,k)$. The edge image can then be used for sharpening by adding it back into the original image, such that:

$$\widehat{G_2}(\omega,k)=G_2(\omega,k)+k^*E(\omega,k) \qquad (10)$$

where parameter k denotes a scaling constant which typically varies between 0.2 and 0.7, with larger values providing increasing amounts of sharpening.

Figure 10:
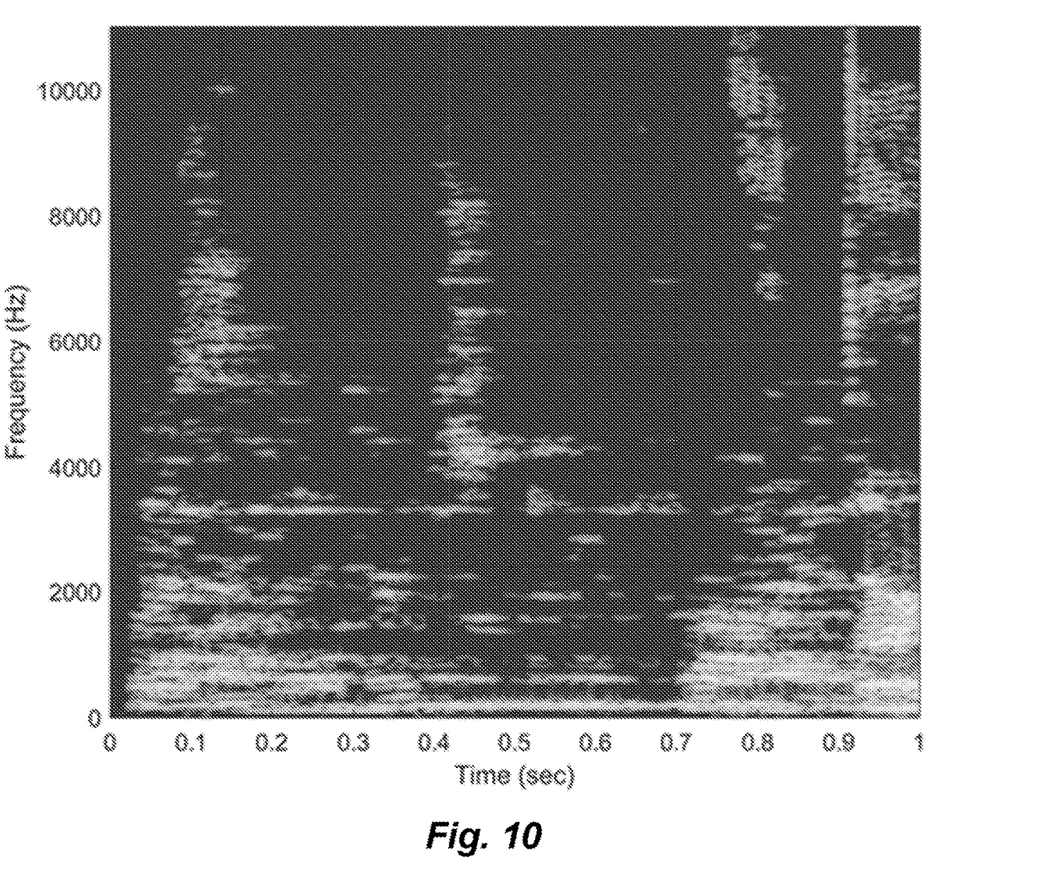
FIG. 10 is a spectrogram of the same phrase after processing with the reverberation mitigation signal processing scheme.

The post-processed gain $\widehat{G_2}(\omega,k)$ is applied to the T-F distribution of the first microphone signal $Y_A(\omega,k)$ and the T-F distribution of the second microphone digital audio signal $Y_B(\omega,k)$ to produce another set of signals that are subsequently transformed by a time domain transform module back to the time-domain using an inverse time-frequency transformation. The estimated enhanced signals such as the one plotted in FIG. 10 can then be routed to an audio output module that generates an output perceivable to the wearer of a hearing instrument or any other audio device.

The gain estimation stages discussed herein do not require access to a theoretical clean or an uncorrupted signal, and therefore the present approach is 'blind' and generalizable to any acoustical environment. The statistical parameters necessary to form either the hard or soft decision masks can be easily adapted based on information extracted exclusively from the microphone signal outputs. Algorithms can be easily integrated in existing audio processors equipped with two spaced-apart external microphones and can operate in parallel or in conjunction with a beamforming module to enhance the acoustic input. Such embodiments provide a robust technique for suppression of room reverberation inherent in the signals recorded by two spatially separated microphones, and also can provide adequate suppression of background noise from a number of interfering speakers.

Embodiments of the invention may be implemented in part in any conventional computer programming language such as VHDL, SystemC, Verilog, ASM, etc. Alternative embodiments of the invention may be implemented as pre-programmed hardware elements, other related components, or as a combination of hardware and software components.

Embodiments can be implemented in part as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

Although various exemplary embodiments of the invention have been disclosed, it should be apparent to those skilled in the art that various changes and modifications can be made which will achieve some of the advantages of the invention without departing from the true scope of the invention.

What is claimed is:

1. A method of dual microphone signal processing to reduce reverberation, the method comprising:
    developing time domain microphone signals from a pair of sensing microphones, the microphone signals having sound source components and reverberation components;
    converting the microphone signals to time-frequency domain to produce complex value spectra signals;
    determining frequency-specific energy ratios between the spectra signals;
    applying a binary gain function to the spectra signals based on the energy ratios to produce transformed spectra signals;
    determining an inter-microphone coherence value between the transformed spectra signals;
    applying a sigmoid gain function to the transformed spectra signals based on the inter-microphone coherence value to produce coherence adapted spectra signals; and
    applying an inverse time-frequency transformation to the coherence adjusted spectra signals to produce time-domain reverberation-compensated microphone signals with reduced reverberation components.

2. The method according to claim 1, wherein applying a sigmoid gain function includes using a two-dimensional enhancement image filter to produce an edge image enhanced sigmoid gain function that is applied to the transformed spectra signals.

3. The method according to claim 1, wherein applying the binary gain function includes comparing individual frequency-specific energy ratios to a selected threshold value to reduce the reverberation components.

4. The method according to claim 1, wherein the inter-microphone coherence value is a function of power spectral densities of the transformed spectra signals.

5. The method according to claim 1, wherein the sigmoid gain function is a tunable two-parameter logistic sigmoid function.

6. The method according to claim 1, wherein the sigmoid gain function is adaptively determined for specific frequencies in the transformed spectra signals.

7. The method according to claim 1, further comprising:
    generating an audio output signal from the reverberation-compensated microphone signals.

8. A signal processing system for processing dual microphone signals to reduce reverberation, the system comprising:
    a pair of sensing microphones that develop time domain microphone signals having sound source components and reverberation components;
    a spectral converter that converts the microphone signals to time-frequency domain to produce complex value spectra signals;
    a binary masking module that determines frequency-specific energy ratios between the spectra signals and applies a binary gain function to the spectra signals based on the energy ratios to produce transformed spectra signals;
    a soft masking module that determines an inter-microphone coherence value between the transformed spectra signals and applies a sigmoid gain function to the transformed spectra signals based on the inter-microphone coherence value to produce coherence adapted spectra signals; and
    a time domain transform module that applies an inverse time-frequency transformation to the coherence adjusted spectra signals to produce time-domain reverberation-compensated microphone signals with reduced reverberation components.

9. The system according to claim 8, wherein the soft masking module uses a two-dimensional enhancement image filter to produce an edge image enhanced sigmoid gain function that is applied to the transformed spectra signals.

10. The system according to claim 8, wherein the binary masking module compares individual frequency-specific energy ratios to a selected threshold value to reduce the reverberation components.

11. The system according to claim 8, wherein the soft masking module determines the inter-microphone coherence value as a function of power spectral densities of the transformed spectra signals.

12. The system according to claim 8, wherein the binary masking module determines the sigmoid gain function as a tunable two-parameter logistic sigmoid function.

13. The system according to claim 8, wherein the soft masking module adaptively determines the sigmoid gain function for specific frequencies in the transformed spectra signals.

14. The system according to claim 8, further comprising:
an audio output module that generates an audio output signal from the reverberation-compensated microphone signals.

* * * * *